United States Patent
Gremillet

(10) Patent No.: US 7,425,908 B2
(45) Date of Patent: Sep. 16, 2008

(54) METHOD OF GENERATING A DIGITAL SIGNAL THAT IS REPRESENTATIVE OF MATCH ERRORS IN AN ANALOG DIGITAL CONVERSION SYSTEM WITH THE TIME INTERLEAVING, AND AN ANALOG DIGITAL CONVERTER WITH TIME INTERLEAVING USING SAME

(75) Inventor: Patrick Gremillet, Versailles (FR)

(73) Assignee: Thales (FR)

( * ) Notice: Subject to any disclaimer, the term of this patent is extended or adjusted under 35 U.S.C. 154(b) by 0 days.

(21) Appl. No.: 10/581,549

(22) PCT Filed: Nov. 30, 2004

(86) PCT No.: PCT/EP2004/053172

§ 371 (c)(1),
(2), (4) Date: Mar. 19, 2007

(87) PCT Pub. No.: WO2005/055430

PCT Pub. Date: Jun. 16, 2005

(65) Prior Publication Data
US 2007/0247344 A1    Oct. 25, 2007

(30) Foreign Application Priority Data
Dec. 5, 2003    (FR) .................................. 03 14309

(51) Int. Cl.
*H03M 1/10*    (2006.01)
(52) U.S. Cl. ...................... 341/120; 341/155
(58) Field of Classification Search .......... 341/120–155
See application file for complete search history.

(56) References Cited

U.S. PATENT DOCUMENTS 5,294,926 A * 3/1994 Corcoran ...................... 341/120
7,049,984 B2 * 5/2006 Wood et al. .................. 341/120
7,283,074 B2 * 10/2007 Sheng et al. ................. 341/120

FOREIGN PATENT DOCUMENTS

JP    06152410    8/1994

OTHER PUBLICATIONS

Hummels D.M, Distortion Compensation for Time-Interleaved ADC, Jun. 4-5, 1996, IEEE.*
Hummels D. M., et et al., Distortion Compensation for Time-Intrleved Analog to Digital Converters, IEEE 1996, Brussels, Belgum, Jun. 4-6, 1996.

* cited by examiner

*Primary Examiner*—Lam T Mai
(74) *Attorney, Agent, or Firm*—Lowe Hauptman Ham & Berner, LLP

(57) ABSTRACT

A method for generating a digital signal representative of the pairing error between the channels of an analog digital conversion system with time interleaving, and a method for suppressing the errors thus calculated and an analog digital conversion system with time interleaving using same. The method comprises determining a spectrum (11-12) of the digital signal as a function of a frequency response of the analog digital conversion system with time interleaving (CAN 10) to at least one analog calibration signal (IC), and generating a "comb" signal whose spectrum is composed of frequency lines kFs/N, where Fs is a sampling frequency and N a number of channels of the analog digital conversion system with time interleaving, and whose amplitude is dependent on the frequency response of the analog digital converter.

11 Claims, 4 Drawing Sheets

Figure 1:
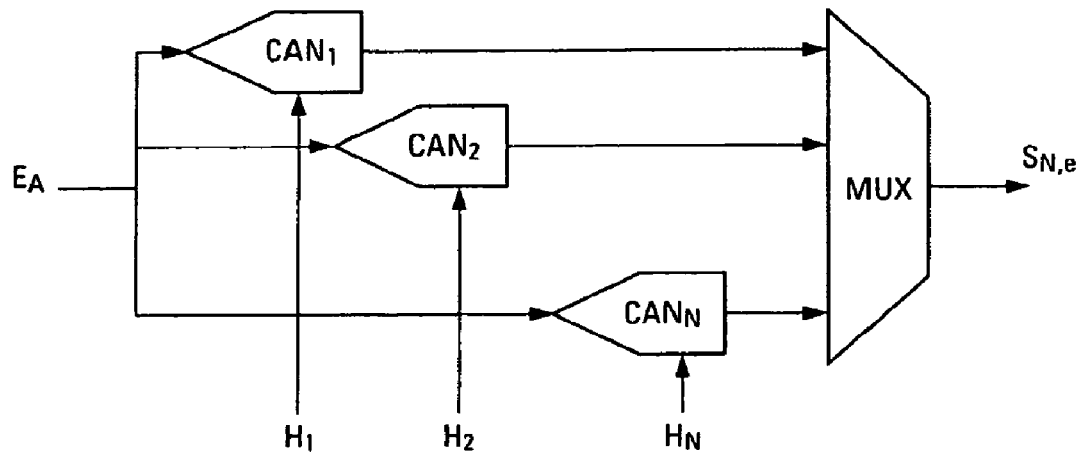

METHOD OF GENERATING A DIGITAL SIGNAL THAT IS REPRESENTATIVE OF MATCH ERRORS IN AN ANALOG DIGITAL CONVERSION SYSTEM WITH THE TIME INTERLEAVING, AND AN ANALOG DIGITAL CONVERTER WITH TIME INTERLEAVING USING SAME

The invention relates to a method for generating a digital signal representative of the pairing error between the channels of an analog digital conversion system with time interleaving, a method for suppressing the errors thus calculated and an analog digital conversion system with time interleaving using same.

The two main characteristics of an analog digital converter are, of course, its resolution in bits and its sampling frequency.

In order to increase the speed of analog digital converters, a conventional solution consists in using several conversion channels in parallel controlled sequentially, on the basis of a divided and shifted main clock.

These analog digital conversion systems with time interleaving exhibit however errors related to the imperfect pairing between the channels. In particular, these errors can result from voltage shifts, differences of gain, differences of frequency or phase response, and deviations in the instants of sampling of the various channels.

In order to preserve the benefit of such a structure, minimization of the pairing errors of the channels is indispensable. This minimization can be performed either by reducing (a priori) as far as possible the differences between the channels, or by correcting (a posteriori) the digitized signal.

A certain number of techniques can be employed to minimize the pairing errors between the channels of analog digital conversion systems with time interleaving.

American patent U.S. Pat. No. 4,633,226 from Black, Jr. granted on 30 Dec. 1986 proposes that a certain number of elements be pooled between the channels so as to decrease the number of nonmatched elements. This type of solution presupposes the modification of the analog digital converters used in each channel, this not always being possible.

Another solution, conventionally used, attacks the source of the channel pairing errors. In particular, it proposes the adjustment of the phase of the sampling clocks (as in American patent U.S. Pat. No. 4,763,105 from Jenq granted on 9 Aug. 1988), of the offset voltages, of the differences of gain of each channel. This solution presupposes an adjustment of each parameter concerned for each channel. This leads therefore to complex realizations. Moreover these adjustments, in particular in the case of the phase of the sampling clocks, are sources of additional noise. This solution can therefore lead to a degradation in the dynamic performance of the analog digital conversion system with time interleaving.

Processing of the signal can also allow correction of pairing errors, in particular by the use of digital equalizer filters. The equalizers can use, to do this, the difference in response of the channels with respect to a channel taken as reference such as indicated, for example, in American patent U.S. Pat. No. 5,239,299 from Apple et al. granted on 24 Aug. 1993. This type of solution corrects, after digital conversion, the effects of the pairing errors of the channels. The correction depends on the quality of the filters used. The correction cannot therefore be ideal over the totality of the spectrum except through the use of a prohibitive amount of hardware.

These techniques aim therefore either to act at the source, namely on the (analog) differences between the conversion channels; or to act on the digitized signal, by processing the effects of the defects which get aggregated with the sampled signal. In the latter case, the operation is therefore two-fold since it involves firstly extracting the defects of the signal at the output of the converter then, thereafter, eliminating them.

The present invention makes it possible to alleviate or, at least, to reduce these drawbacks by correcting the pairing errors between the channels of analog digital conversion systems with time interleaving by the direct creation of digital signals representative of these errors, and their subtraction from the digitized signal at the output of the conversion system.

An object of the invention is a method for generating a digital signal representative of the pairing error between the channels of an analog digital conversion system with time interleaving comprising an analog digital converter on each channel. The said method comprises the determination of the spectrum of said digital signal as a function of the frequency response of the analog digital conversion system with time interleaving to at least one analog calibration signal.

The proposed solution in addition to the advantage of being digital is less complex since it does not require the extraction of the defects of the signal at the output of the converter.

Another object of the invention is a method of suppressing the pairing errors between the channels of an analog digital converter, comprising the generation of a digital signal representative of the pairing error between the channels according to the generation method above and the subtraction from the signal at the output of the analog digital converter of said generated digital signal.

The invention is also aimed at an analog digital conversion system with time interleaving of sampling frequency Fs comprising:

N analog digital converters driven by a clock of sampling frequency Fs/N;

means for generating a digital signal representative of the pairing error and driven by said clock of frequency Fs;

means of subtraction from the output signal of said analog digital converter of the digital signal generated by said generation means.

Figure 2:
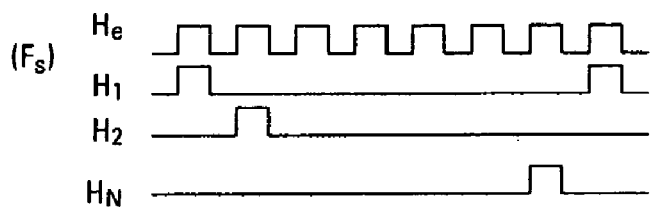
Figure 3:
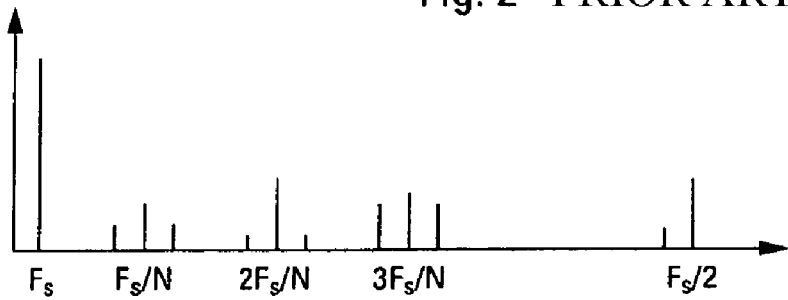
Figure 4:
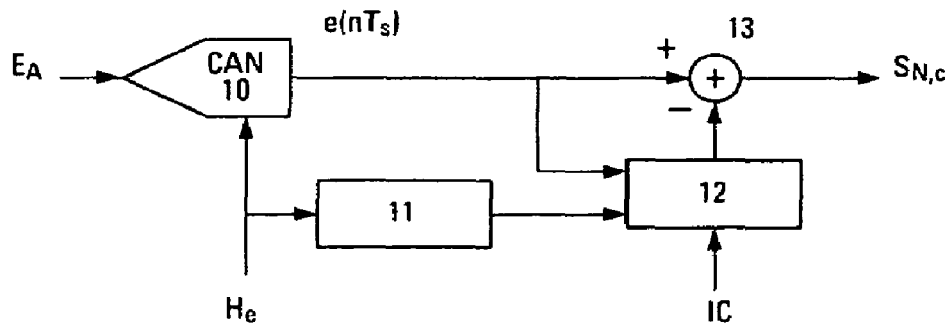
Figure 5:
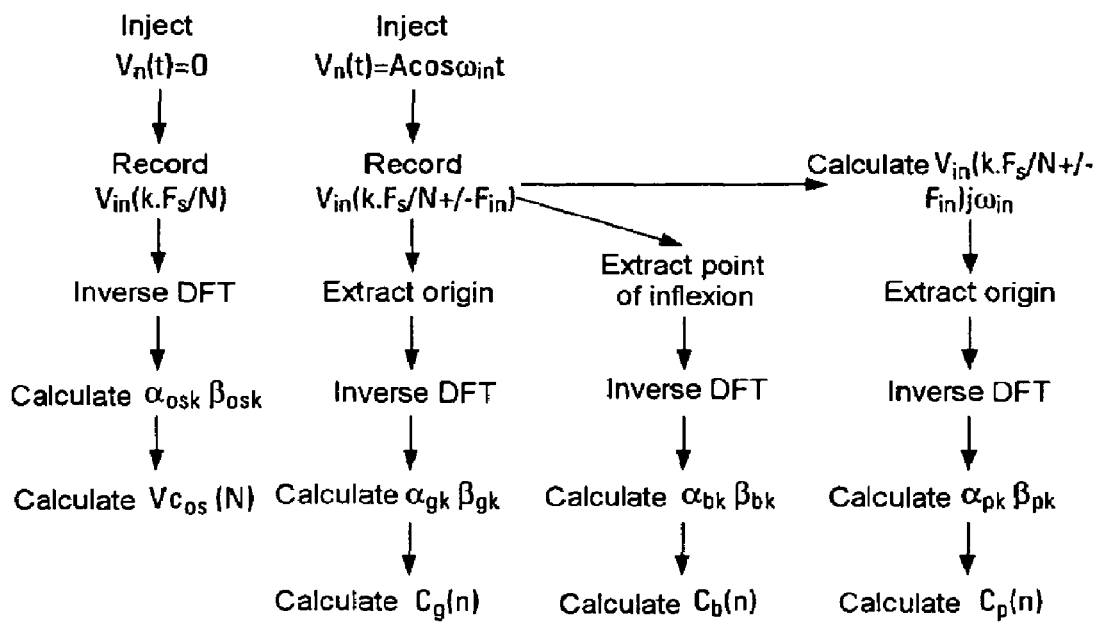
Figure 6:
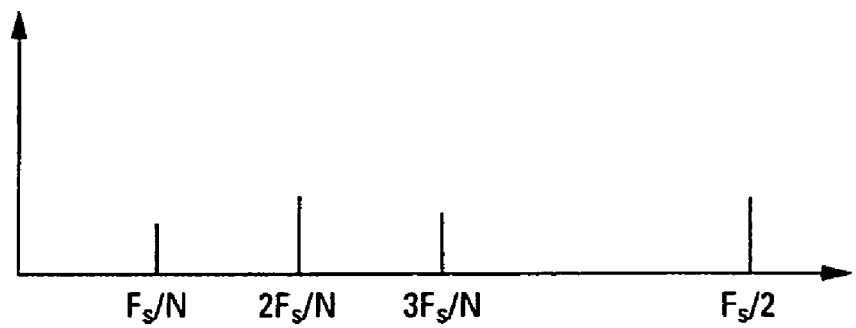
Figure 7:
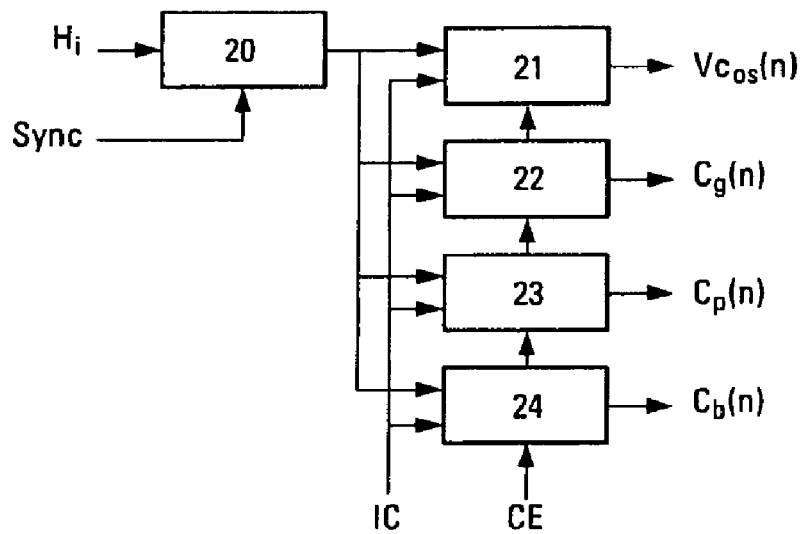
Figure 8:
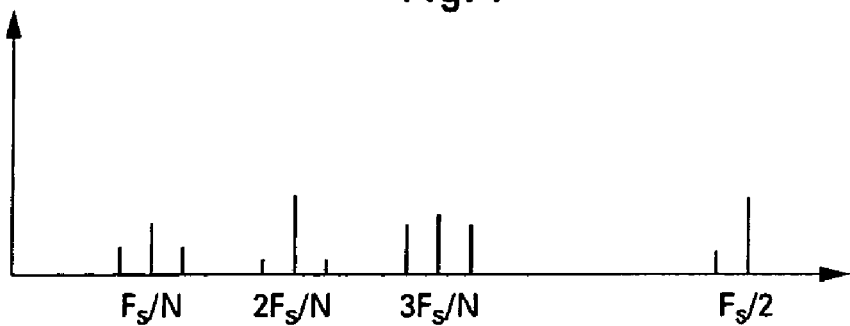
Figure 9:
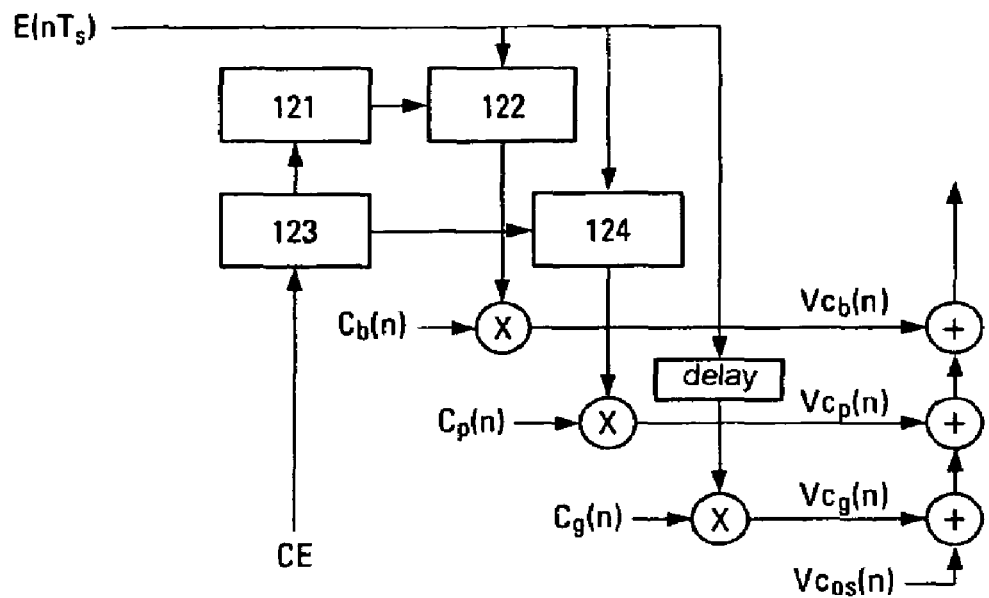
Figure 10:
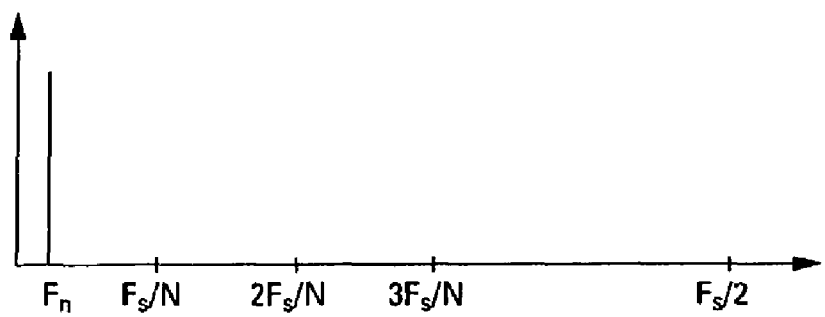

The characteristics and advantages of the invention will appear more clearly on reading the description, given by way of example, and the figures relating thereto which represent:

FIG. 1, a block diagram illustrating the principle of the analog digital conversion system with time interleaving, according to the prior art, FIG. 2, a chart of the various clocks for sampling the analog digital conversion system with time interleaving, according to the prior art, FIG. 3, a chart of the spectrum of the sampled signal obtained at the output of the analog digital conversion system with time interleaving, according to the prior art, FIG. 4, a block diagram illustrating the principle of frequency correction of the pairing errors of an analog digital conversion system with time interleaving, according to the invention, FIG. 5, an exemplary embodiment of the determination of the calibration information IC on the basis of the frequency response of the analog digital conversion system with time interleaving, according to the invention, FIG. 6, a chart of the spectrum of the signal at the output of the device for generating "comb" signals appearing in the means for generating the signal representative of the pairing errors, according to the invention, FIG. 7, a block diagram of an example of means of calculation of the calibration information, according to the invention, FIG. 8, a chart of the spectrum of the signal at the output of the amplitude modulation device appearing in the means for generating the signal representative of the pairing errors, according to the invention, FIG. 9, a block diagram of the amplitude modulation device appearing in the means for generating the signal representative of the pairing errors, according to the invention, FIG. 10, a chart of the spectrum of the digitized signal after subtraction of the signal obtained by the means for generating the signal representative of the pairing errors, according to the invention.

FIG. 1 illustrates an analog digital conversion system with time interleaving. The analog digital conversion system with time interleaving comprises N channels. Each channel n comprises an analog digital converter $CAN_i$ driven by a clock $H_i$.

As illustrated in FIG. 2, when the sampling clock $H_e$ of the analog digital conversion system with time interleaving has a frequency Fs, each of the clocks $H_i$ has a frequency Fs/N. Furthermore, the clock $H_i$ is offset from the clock $H_{i-1}$ of the neighboring channel by a period 1/Fs.

The analog input signal $E_A$ is therefore sampled on each of the channels at the frequency Fs/N at an instant offset by 1/Fs with respect to the neighboring channel. The signals sampled at the output of the analog digital converters $CAN_i$ are thereafter multiplexed by the multiplexer MUX to obtain the digital signal $e(nT_s)$ sampled at the frequency Fs.

The placement in parallel of several conversion channels controlled sequentially, on the basis of a divided and offset main clock is a conventional solution for increasing the speed of analog digital converters.

These analog digital conversion systems with time interleaving exhibit however errors related to the imperfect pairing between the channels. In analog digital conversion systems with time interleaving, such as that illustrated by FIG. 1, the pairing defects of the various channels are sources of errors.

The pairing defects between the various channels of the analog digital conversion system with time interleaving appear in the spectrum of the sampled signal in the form of spurious spectra around the frequencies k.Fs/N, as shown in FIG. 3. Fs is the frequency of the sampling clock and N the number of channels of the analog digital conversion system with time interleaving. The spectrum of the sampled signal of FIG. 3 is that obtained for a sinusoidal input signal of frequency $F_{in}$.

These matches relate to:

The offset voltages: the error will then give rise to the occurrence of lines at the fixed frequencies k.Fs/N of amplitude related to the offset voltage between the channels.

The gain: the error will then give rise to the occurrence of spectra around the frequencies kFs/N of amplitude related to the deviation in gain between the channels. This phenomenon is akin to an amplitude modulation.

The phase or the timing: the error will then give rise to the occurrence of spectra around the frequency kFs/N, of amplitude related to the temporal deviation of the sampling clock between the channels. This phenomenon is akin to a frequency modulation.

The passband: the error will then give rise to a gain and a different phase on the input signal and hence a combination of the previous two errors.

The invention consists of a method making it possible, by digital modulation of signals of frequency k.Fs/N with the aid of information obtained by calibration, to create signals of phase and of amplitude neighboring those of the defects, and in subtracting them from the digitized signal.

The main advantages of this method of suppressing pairing errors are:
the correction by digital processing of the sampled signal;
the direct processing of the errors induced by the interleaving.

Hence a double simplification of the processing: no need to extract the error from the useful signal and a lesser accuracy requirement in the calculations.

FIG. 4 shows an example of implementation of the method of suppression according to the invention thus making it possible to cancel or to decrease the pairing defects.

Initially, the spectrum of the digital signal representative of the pairing defects is determined as a function of the frequency response of the analog digital conversion system with time interleaving to at least one calibration signal. The calibration signal consists of a known analog signal. Thus, during this step also called the "calibration phase", known analog signals are injected into the analog digital conversion system with time interleaving. The amplitudes and some phases of the various spurious lines are then determined. On the basis of this frequency response, calibration information IC comprising, in particular, the value of the various offset voltages and/or the deviations in gain and/or in phase etc. between the channels can be determined.

By analyzing the spectrum of the sampled signal, calibration information IC can be determined. Specifically, the sampled signal s(n) at the output of the analog digital conversion system with time interleaving is a discrete periodic signal of period N $X_N(n)$ that may be written in the form of a Fourrier series:

$$x_N(n) = \sum_{l=0}^{N-1} C_l e^{j2\pi \frac{l}{N}n} \text{ with } C_l = \frac{1}{N}\sum_{k=0}^{N-1} x_N(k) e^{-j2\pi \frac{l}{N}k}$$

$$x_N(n) = \sum_{l=0}^{N-1}\sum_{k=0}^{N-1} \frac{1}{N} x_N(k) e^{j2\pi \frac{l}{N}(n-k)} = \sum_{l=0}^{N-1} \frac{1}{N} e^{j2\pi \frac{l}{N}n} \sum_{k=0}^{N-1} x_N(k) e^{-j2\pi \frac{l}{N}k}$$

If the input e(t) of the analog digital conversion system with time interleaving is an arbitrary signal, the sampled signal is a signal $e_1(t)$ where $e_1$ is the result of the influence of the passband limited to $\omega_0$ on e.

The output of the analog digital conversion system with time interleaving with N channels is then the following:

$$s(n) = \Delta V_k + (1 + \Delta G_k) e_{1k}(nT_s + \Delta t_k) \quad \text{with } k \equiv n[N]$$
$$= \Delta V_k + e_{1k}(nT_S + \Delta t_k) + \Delta G_k e_{1k}(nT_S + \Delta t_k)$$

by denoting:

$\Delta V_k$ the offset voltage of channel k $\Delta G_k$ the amplitude gain error of channel k (the gain is normalized to 1)

$\Delta t_k$ the temporal deviation of channel k $\Delta \omega_k$ the passband deviation of channel k (with respect to a nominal passband at −3 dB $\omega_0$)

$T_s$ the period of the sampling clock $e_{1k}$ the result of the influence of the passband limited to $\omega_0 + \omega_k$ on e.

In general the temporal deviation is very small compared with the sampling period, the deviation in gain very small compared with 1, the passband deviation very small compared with the passband. The output of the analog digital conversion system with time interleaving with N channels can therefore be approximated to first order:

$$s(n) = e_{1k}(nT_S) + \Delta V_k + \frac{de_1}{dt}(nT_s)\Delta t_k + e_{1k}(nT_S)\Delta G_k + \frac{de_1}{d\omega_0}(nT_s)\Delta\omega_k \text{ with } k \equiv n[N]$$

If the influence of the passband limited to $\omega_0$ is regarded as due to a first-order system, the Laplace transform of $e_1(t)$ is $$E_1(p) = \frac{\omega_0}{p+\omega_0}E(p),$$

and therefore the variation sensitivity of $\omega_0$ is:

$$\frac{dE_1}{d\omega_0}(p) = \frac{p}{(p+\omega_0)^2}E(p) = \frac{1}{\omega_0}\frac{p}{p+\omega_0}E(p) = \frac{1}{\omega_0}E_2(p),$$

denoting by $e_2(t)$ the result of the filtering of $e_1(t)$ by the high-pass filter with response $p/(p+\omega_0)$.

By using the expression in the form of a Fourier series, the error in the output of the analog digital conversion system with time interleaving with N channels $\Delta s(n)=s(n)-e(nT_s)$ can therefore be written:

$$\Delta s(n) = \sum_{l=0}^{N-1} e^{j2\pi\frac{l}{N}n}\begin{bmatrix} \frac{1}{N}\sum_{k=0}^{N-1}\Delta V_k e^{-j2\pi\frac{l}{N}k} + e_1(nT_s)\frac{1}{N}\sum_{k=0}^{N-1}\Delta G_k e^{-j2\pi\frac{l}{N}k} + \\ \frac{de_1}{dt}(nT_s)\frac{1}{N}\sum_{k=0}^{N-1}\Delta t_k e^{-j2\pi\frac{l}{N}k} + e_2(nT_s)\frac{1}{N}\sum_{k=0}^{N-1}\frac{\Delta\omega_k}{\omega_0}e^{-j2\pi\frac{l}{N}k} \end{bmatrix}$$

The spectrum of the error is therefore:

$$F(\Delta s(\omega)) = \sum_{l=-\infty}^{+\infty} e^{j\omega nT_S}\sum_{l=0}^{N-1}e^{j2\pi\frac{l}{N}n}\begin{bmatrix} \frac{1}{N}\sum_{k=0}^{N-1}\Delta V_k e^{-j2\pi\frac{l}{N}k} + \\ e_1(nT_s)\frac{1}{N}\sum_{k=0}^{N-1}\Delta G_k e^{-j2\pi\frac{l}{N}k} + \\ \frac{de_1}{dt}(nT_s)\frac{1}{N}\sum_{k=0}^{N-1}\Delta t_k e^{-j2\pi\frac{l}{N}k} + \\ e_2(nT_s)\frac{1}{N}\sum_{k=0}^{N-1}\frac{\Delta\omega_k}{\omega_0}e^{-j2\pi\frac{l}{N}k} \end{bmatrix} =$$

$$\begin{bmatrix} \frac{1}{N}\sum_{l=0}^{N-1}1\left(\omega-l\frac{\omega_S}{N}\right)F(\Delta V(l)) + \frac{1}{N}\sum_{l=0}^{N-1}F\left(e_1\left(\omega-l\frac{\omega_S}{N}\right)\right)F(\Delta G(l)) + \\ \frac{1}{N}\sum_{l=0}^{N-1}F\left(\frac{de_1}{dt}\left(\omega-l\frac{\omega_S}{N}\right)\right)F(\Delta t(l)) + \frac{1}{N}\sum_{l=0}^{N-1}F\left(H\left(e_1\left(\omega-l\frac{\omega_S}{N}\right)\right)\right)\frac{F(\Delta\omega(l))}{\omega_0} \end{bmatrix}$$

with the following notation:
$1(\omega)$ is a signal which equals 1 for $\omega=0$ and 0 otherwise
$F(e_1)$ is the Fourier transform of $e_1(t)$
$F(de_1/dt)$ is the Fourier transform of $de_1/dt$
$F(\Delta V)$ is the Fourier transform (discrete) of the vector $\Delta V_k$
$F(\Delta G)$ is the Fourier transform (discrete) of the vector $\Delta G_k$
$F(\Delta t)$ is the Fourier transform (discrete) of the vector $\Delta t_k$
$F(\Delta\omega)$ is the Fourier transform (discrete) of the vector $\Delta\omega_k$
H is the frequency response of the high-pass filter $p/(p+\omega_0)$.
$\omega_s = 2\pi/T_s$ From the spurious spectra therefore appear:
lines relating to the offset voltages, at the frequency which is a multiple of $F_s/N$ with a value equal to $1/NF(\Delta V(l))$;
spectra relating to the gain errors, comprising the spectrum of $e_1(t)$ transposed around the frequencies which are multiples of $F_s/N$, with a value equal to $1/NF(e_1(\omega))F(\Delta G(l))$;
spectra relating to the phase errors, comprising the spectrum of $de_1/dt(t)$ transposed around the frequencies which are multiples of $F_s/N$, with a value equal to $1/NF(de_1/dt(\omega))F(\Delta t(l))$;
spectra relating to the passband errors, comprising the result of the filtering of $e_1(t)$ by the high-pass $p/(p+\omega_0)$, transposed around the frequencies which are multiples of $F_s/N$, with a value equal to $1/NF(H(e_1(\omega)))F(\Delta\omega(l))$.

The digital signal representative of the pairing errors therefore comprises:

frequency lines $$f_{os} = \frac{F_S}{N}, l = 0, 1, \ldots, N-1$$

with an amplitude $$A_{os} = \frac{1}{N}\sum_{k=0}^{N-1}\Delta V_k e^{-j2\pi\frac{l}{N}k},$$

corresponding to a signal representative of the shift errors $$V_{C_{os}}(n) = \frac{1}{N}\sum_{l=0}^{N-1}\sum_{k=0}^{N-1}\Delta V_k e^{j2\pi\frac{l}{N}(n-k)};$$

spectra around the frequencies $$f_{os} = \frac{F_S}{N}, l = 0, 1, \ldots, N-1$$

obtained by amplitude modulation by the input signal of lines of amplitude $$A_g = \frac{1}{N}\sum_{k=0}^{N-1}\Delta G_k e^{-j2\pi\frac{l}{N}k},$$

corresponding to a signal representative of the gain errors $$Vc_g(n) = \frac{1}{N} e_1(nT_S) \sum_{l=0}^{N-1} \sum_{k=0}^{N-1} \Delta G_k e^{j2\pi \frac{l}{N}(n-k)} = e_1(nT_S) \cdot C_g(n);$$

spectra around the frequencies $$f_{os} = \frac{F_S}{N}, l = 0, 1, \ldots, N-1$$

obtained by amplitude modulation by the derivative of the input signal of lines of amplitude $$A_P = \frac{1}{N} \sum_{k=0}^{N-1} \Delta t_k e^{-j2\pi \frac{l}{N}k},$$

corresponding to a signal representative of the phase errors $$Vc_p(n) = \frac{1}{N} \frac{de_1}{dt}(nT_S) \sum_{l=0}^{N-1} \sum_{k=0}^{N-1} \Delta t_k e^{j2\pi \frac{l}{N}(n-k)} = \frac{de_1}{dt}(nT_S) \cdot C_p(n);$$

spectra around the frequencies $$f_{os} = \frac{F_S}{N}, l = 0, 1, \ldots, N-1$$

obtained by amplitude modulation by the result of the high-pass filtering $p/(p+\omega_0)$ of the signal $e_1(t)$ of lines of amplitude $$A_b = \frac{1}{N} \sum_{k=0}^{N-1} \frac{\Delta \omega_k}{\omega_0} e^{-j2\pi \frac{l}{N}k},$$

corresponding to a signal representative of the passband errors $$Vc_b(n) = \frac{1}{N} e_2(nT_S) \sum_{l=0}^{N-1} \sum_{k=0}^{N-1} \frac{\Delta \omega_k}{\omega_0} e^{j2\pi \frac{l}{N}(n-k)} = e_2(nT_S) \cdot C_b(n).$$

The calibration phase therefore comprises the injection at the input of the analog digital conversion system with time interleaving of analog signals of known frequency and of known amplitude (in particular pure sinusoids) as shown in the example of the calibration method illustrated by FIG. 5.

The analysis of the spectrum of the signal sampled at the output of the analog digital conversion system with time interleaving is facilitated by the fact that:
- the spurious lines relating to the offset voltages are proportional to the discrete Fourier transform of the vector $\Delta V_k$;
- the spurious lines relating to the gain errors are proportional to the discrete Fourier transform of the vector $\Delta G_k$;
- the spurious lines relating to the phase errors are proportional to the discrete Fourier transform of the vector $\Delta t_k$;
- the spurious lines relating to the passband errors are proportional to the discrete Fourier transform of the vector $\Delta \omega_k/\omega_0$.
- the components of the vectors $\Delta V_k$, $\Delta G_k$, $\Delta t_k$, $\Delta \omega_k$ can therefore be extracted from the spectra of the signals sampled by inverse discrete Fourier transform.

Initially a signal $V_n(t)=0$ is injected, the signal sampled at the output of the analog digital converter is recorded and its spectrum calculated by Fourier transform. From the values at $kF_s/N$ are extracted by inverse discrete Fourier transform coefficients $\alpha_{OSk}$, $\beta_{osk}$ on the basis of which the signal $Vc_{os}(n)$ representative of the offset voltage errors is calculated.

Subsequently signals $V_n(t)=A\cos\omega_{in}(t)$ with several values of $\omega_{in}$ are injected, the signals sampled at the output of the analog digital converter are recorded and their spectrum calculated by Fourier transform. The values $kF_s/N \pm F_{in}$ are thereafter extracted as a function of $\omega_{in}$.

Origin points are extracted by inverse discrete Fourier transform of the coefficients $\alpha_{gk}$, $\beta_{gk}$ on the basis of which the coefficient $C_g(n)$ multiplying the input signal making it possible to generate the signal representative of the gain errors is calculated.

Inflection points are extracted by inverse discrete Fourier transform of the coefficients ($\alpha_{bk}$, $\beta_{bk}$ on the basis of which the coefficient $C_b(n)$ multiplying the input signal making it possible to generate the signal representative of the passband errors is calculated.

On the basis of the same sampled signals are extracted the curves $V_n(kF_s/N+/-F_{in})/j\omega_{in}$ as a function of $\omega_{in}$. From the origin points are extracted by inverse discrete Fourier transform the information of the coefficients $\alpha_{pk}$, $\beta_{pk}$ on the basis of which the coefficient $C_p(n)$ multiplying the input signal making it possible to generate the signal representative of the phase errors is calculated.

The whole set of signals $Vc_{os}$ and coefficients $C_g(n)$, $C_b(n)$ and $C_p(n)$ thus determined constitute calibration information IC.

Subsequently, hereafter dubbed the operational phase, i.e. phase during which arbitrary signals are sampled by the analog digital conversion system with time interleaving, a digital signal is generated representative of the pairing errors of the channels. For example, said digital signal can be generated in the form of a "comb" signal whose spectrum is composed of frequency lines kFs/N (where Fs is the sampling frequency and N the number of channels of the analog digital conversion system with time interleaving (CAN 10)) and the amplitude dependent on the frequency response of the analog digital converter. In particular, this signal can be obtained by modulation of the "comb" signals of frequency kFs/N as a function of the frequency response, for example with the aid of the calibration information IC. These signals have a spectrum identical to that of the pairing errors as shown in FIG. 8.

In the example of FIG. 4, the analog input signal $E_A$ is converted by the analog digital conversion system CAN 10 according to the sampling clock $H_e$. The sampling clock $H_e$ drives means for generating a signal of comb type 11.

The generation of "comb"-type signals on the basis of the sampling clock can comprise the creation of digital signals corresponding to the lines of the type $$C_i = \frac{1}{N}\sum_{k=0}^{N-1}\Delta C_{ik}e^{-j2\pi\frac{l}{N}k}$$

which can be written in the following form, involving real signals:

$$C_i(n) = \frac{1}{N}\sum_{l=0}^{N-1}\sum_{k=0}^{N-1}\Delta C_{ik}e^{j2\pi\frac{l}{N}(n-k)}$$

$$= \sum_{l=0}^{N-1}\left[\left(\frac{1}{N}\sum_{k=0}^{N-1}\Delta C_{ik}\cos 2\pi\frac{l}{N}k\right)\cos 2\pi\frac{l}{N}n + \left(\frac{1}{N}\sum_{k=0}^{N-1}\Delta C_{ik}\sin 2\pi\frac{l}{N}k\right)\sin 2\pi\frac{l}{N}n\right]$$

$$= \sum_{l=0}^{N-1}\alpha_{il}\cos 2\pi\frac{l}{N}n + \beta_{il}\sin 2\pi\frac{l}{N}n$$

This signal possesses a spectrum composed of lines $kF_s/N$ as illustrated in FIG. 6. The coefficients $\alpha_{il}$ and $\beta_{il}$ can be obtained during the calibration phase as shown in FIG. 5. FIG. 7 gives an example of implementation of the calculation of $C_i$, the values $C_i(n)$ then constituting the calibration information IC can be placed in memory for values of n lying between 0 and N-1. This memory addressed cyclically by n (arbitrary) makes it possible, thereafter, to output the values of $C_i$.

A counter 20 is synchronized by a signal sync and driven by the sampling clock $H_e$. This counter 20 allows the calibration information IC to be placed in cyclic memory. According to the calibration information IC, it is placed respectively in the memory relating to the offset voltages 21, to the gain errors 22, to the phase errors 23 and to the passband errors 24. These memories 21, 22, 23, 24 are write controlled by a command CE and respectively provide the values $Vc_{os}(n)$, $C_g(n)$, $C_p(n)$ and $C_b(n)$.

In this example, the values $Vc_{os}(n)$, $C_g(n)$, $C_p(n)$ and $C_b(n)$ are calculated prior to the modulation of the input signal sampled during the phase for calibrating the analog digital conversion system with time interleaving, and maintained in memory for use as calibration information by the amplitude modulation means in the operational phase of the analog digital conversion system with time interleaving.

The amplitude modulation means 12 receive the comb signal obtained and effect its modulation by the sampled signal $e(nT_s)$ using calibration information IC, as indicated in FIG. 4.

This signal can be modulated by the input signal or the information extracted from the sampled signal (derivative, high-pass filtering). Thus are obtained signals representative of the gain errors $Vc_g(n)$ and/or of the phase errors $Vc_p(n)$ and/or of the passband errors $Vc_b(n)$ through the product of the appropriate calibration information IC: i.e. of the respective coefficient $C_g$, $C_p$ or $C_b$ with respectively the input signal $e(nT_s)$, an approximation $s'(n)$ of its derivative $de/dt(nT_s)$ or of the result $e_2(n)$ of the high-pass filtering of the input signal.

FIG. 9 shows an example of embodiment of the modulation means 12. The memories 121 and 123 respectively provide the coefficients necessary for the formulation of the high-pass filter H 122 and of the bypass filter 124. The sampled digital signal $e(nT_s)$ at the output of the analog digital converter is either:

directly multiplied by the calibration information IC corresponding to the coefficient $C_g$ to obtain a signal representative of the gain errors $Vc_g(n)$;

filtered by the bypass filter 124 then multiplied by the calibration information IC corresponding to the coefficient $C_p$ to obtain a signal representative of the phase errors $Vc_p(n)$;

filtered by the filter H 122 then multiplied by the calibration information IC corresponding to the coefficient $C_b$ to obtain a signal representative of the passband errors $Vc_b(n)$.

The whole set of these signals representative of pairing errors $Vc_{os}(n)$, $Vc_g(n)$, $Vc_p(n)$ and $Vc_b(n)$ are added together to provide the digital signal representative of the pairing errors (all causes merged).

The digital signal representative of the pairing errors is thereafter subtracted from the digitized signal by virtue of an adder 13 (see FIG. 4).

This type of analog digital conversion system with time interleaving with correction of the pairing errors exhibits a benefit in terms of conversion speed in various applications. The main applications relate to instrumentation systems and digital reception systems, in particular:

instrumentation and test systems, digital oscilloscopes;

digital receivers, in particular for radar and electronic warfare;

direct conversion receivers, in particular for RF demodulation and within the context of software radio.

The invention claimed is:

1. A method for generating a digital signal representative of a pairing error between channels of an analog digital conversion system with time interleaving, said system comprising an analog digital converter on each channel, said method comprising:

determining a spectrum of said digital signal as a function of a frequency response of the analog digital conversion system with time interleaving to at least one analog calibration signal;

generating a comb signal whose spectrum is composed of frequency lines kFs/N;

wherein Fs is a sampling frequency and N a number of channels of the analog digital conversion system with time interleaving, and whose amplitude is dependent on the frequency response of the analog digital converter.

2. The method for generating a digital signal representative of the pairing error as claimed in claim 1, wherein the amplitude is dependent on offset voltages $\Delta V_k$ determined on basis of the frequency response of the analog digital converter.

3. The method for generating a digital signal representative of the pairing error as claimed in claim 1, further comprising generating an amplitude modulation of the comb signal by an input signal digitized by the analog digital conversion system so that the amplitude modulation transforms the spectrum of the comb signal as a function of the frequency response of the analog digital converter.

4. The method for generating a digital signal representative of the pairing error as claimed in claim 3, wherein the amplitude is dependent on deviations in gain $\Delta G_k$ determined on the basis of the frequency response of the analog digital converter.

5. The method for generating a digital signal representative of the pairing error as claimed in claim 1, further comprising generating an amplitude modulation of the comb signal by the derivative $s'(n)$ of an input signal digitized by the conversion system so that the modulation transforms the spectrum of the comb signal as a function of the frequency response of the analog digital converter.

6. The method for generating a digital signal representative of the pairing error as claimed in claim 5, wherein the amplitude is dependent on sampling clock temporal deviations $\Delta t_k$ determined on the basis of the frequency response of the analog digital converter.

7. The method for generating a digital signal representative of the pairing error as claimed in claim 1, further comprising generating an amplitude modulation of the comb signal by the result $e_2(n)$ of a high-pass filtering of an input signal digitized by the conversion system so that the amplitude modulation transforms the spectrum of the comb signal as a function of the frequency response of the analog digital converter.

8. The method for generating a digital signal representative of the pairing error as claimed in claim 7, wherein the amplitude is dependent on passband errors $\Delta\omega_k$ determined on the basis of the frequency response of the analog digital converter.

9. A method for suppressing the pairing errors between the channels of an analog digital converter, said method comprising the generation of a digital signal representative of the pairing error between the channels of an analog digital converter as claimed in claim 1 and a subtraction from a signal at the output of the analog digital converter of said generated digital signal.

10. An analog digital conversion system with time interleaving of sampling frequency Fs comprising N analog digital converters driven by a sampling clock of frequency Fs/N, said system furthermore comprising:
    means for generating a digital signal representative of the pairing error as claimed in claim 1 driven by said clock of frequency Fs;
    means of subtraction from the output signal of said analog digital converter of the digital signal generated by said generation means.

11. The analog digital conversion system with time interleaving as claimed in claim 10, wherein the generation means comprises:
    a device for generating a comb signal driven by said clock of frequency Fs;
    an amplitude modulation device connected to the output of said device for generating a comb signal receiving calibration information determined as a function of said frequency response.

* * * * *